US012566206B2

(12) United States Patent
Spalenka et al.

(10) Patent No.: US 12,566,206 B2
(45) Date of Patent: Mar. 3, 2026

(54) TRANSMISSION LINE MONITORING USING AN OPTICAL BLOWOUT ANEMOMETER

(71) Applicant: LineVision, Inc., Boston, MA (US)

(72) Inventors: Josef Spalenka, Louisville, KY (US);
Rachael Grudt, San Jose, CA (US);
Taylor Mandelbaum, Nyack, NY (US);
Elliott Gould, Somerville, MA (US);
Nathan Pinney, New Albany, IN (US)

(73) Assignee: LineVision, Inc., Boston, MA (US)

( * ) Notice: Subject to any disclaimer, the term of this patent is extended or adjusted under 35 U.S.C. 154(b) by 223 days.

(21) Appl. No.: 18/208,294

(22) Filed: Jun. 11, 2023

(65) Prior Publication Data

US 2023/0400497 A1       Dec. 14, 2023

Related U.S. Application Data

(60) Provisional application No. 63/350,995, filed on Jun. 10, 2022.

(51) Int. Cl.
| | |
|---|---|
| *G01R 31/08* | (2020.01) |
| *G01S 17/50* | (2006.01) |
| *G01W 1/10* | (2006.01) |

(52) U.S. Cl.
CPC ............ *G01R 31/085* (2013.01); *G01S 17/50* (2013.01); *G01W 1/10* (2013.01)

(58) Field of Classification Search
CPC ........ G01R 31/085; G01S 17/50; G01W 1/10; G01P 5/02
See application file for complete search history.

(56) References Cited

U.S. PATENT DOCUMENTS

| | | | |
|---|---|---|---|
| 10,948,531 B2 | 3/2021 | Pinney et al. | |
| 2014/0163884 A1* | 6/2014 | Lilien ...................... | H02G 1/02 |
| | | | 702/3 |
| 2014/0180616 A1* | 6/2014 | Aaserude ............... | G01R 27/02 |
| | | | 702/65 |
| 2015/0268379 A1 | 9/2015 | Lilien et al. | |
| 2019/0235011 A1* | 8/2019 | Pinney ................... | G01S 17/50 |
| 2019/0285662 A1* | 9/2019 | Duncan .................. | G01S 13/95 |
| 2021/0073692 A1 | 3/2021 | Saha et al. | |
| 2021/0356351 A1 | 11/2021 | Manenti et al. | |

OTHER PUBLICATIONS

International Search Report and Written Opinion of the International Searching Authority, mailed on Sep. 28, 2023, from International Application No. PCT/US2023/025010, filed on Jun. 11, 2023. 11 pages.
International Preliminary Report on Patentability, mailed on Dec. 19, 2024, from International Application No. PCT/US2023/025010, filed on Jun. 11, 2023. 9 pages.

* cited by examiner

*Primary Examiner* — Alvaro E Fortich
(74) *Attorney, Agent, or Firm* — HoustonHogle LLP

(57)       ABSTRACT

A method and system for estimating wind speeds around transmission lines. The method comprises constructing statistical correlations between measured conductor blowout and wind speeds for spans of the transmission lines, generating local wind speed scaling coefficients, and using the wind speed scaling coefficients to estimate wind speed for spans from forecasted wind speeds. This is useful for determining the effective cooling wind speed for a conductor span for the purposes of computing a dynamic line rating.

24 Claims, 13 Drawing Sheets

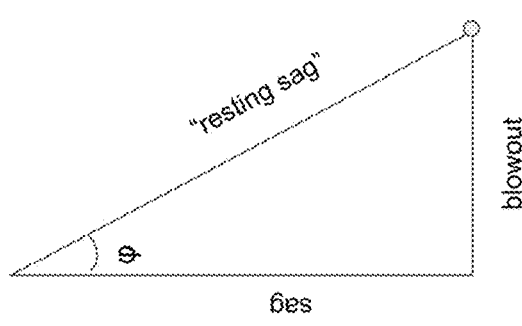

$$tan(\phi) = \frac{d_c \cdot F}{w_c} = \frac{blowout}{sag}$$

$$F = \frac{blowout \cdot w_c}{sag \cdot d_c} = \frac{1}{2} \cdot \rho_{air} \cdot \left(V_{m/s}\right)^2$$

$$V_{m/s} = \sqrt{\frac{2 \cdot blowout \cdot w_c}{sag \cdot d_c \cdot \rho_{air}}}$$

$\phi$ = conductor swing angle (degrees)
$d_c$ = conductor diameter (meters)
$w_c$ = conductor weight (N/m)
$F$ = wind force ($N/m^2$)
$\rho_{air}$ = mass density of air ($kg/m^3$ as function of elevation)

Fig. 3B

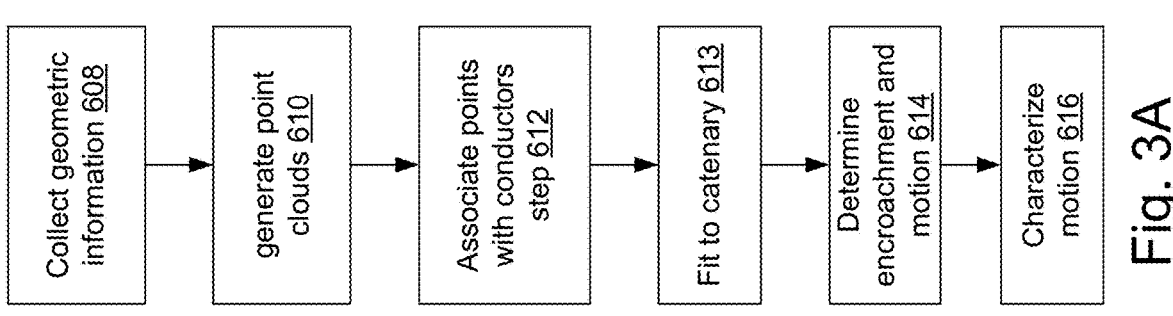

TRANSMISSION LINE MONITORING USING AN OPTICAL BLOWOUT ANEMOMETER

RELATED APPLICATIONS

This application claims the benefit under 35 USC 119(e) of U.S. Provisional Application No. 63/350,995, filed on Jun. 10, 2022, which is incorporated herein by reference in its entirety.

BACKGROUND OF THE INVENTION

Conductor cables for electrical transmission lines typically consist of one or more stranded conductors strung between transmission towers or poles, forming a conductor span. For a given span between two transmission towers, the conductor cables form a characteristic catenary shape that is typical of a hanging cable in a uniform gravitational field. Under the condition of zero wind, the cable catenary is at rest and can be thought of as hanging "straight down" along the direction of gravity. Winds with a vector directional component perpendicular to the wire span impart a horizontal force on the hanging conductor, which swings horizontally in response to the wind force. When viewed from above, the displaced wire will no longer appear as a line, but will instead bow out horizontally with a curved shape approximated by a parabola. The maximum horizontal displacement of the conductor in response to a given wind force is known in the electric power utility industry as "blowout". The conductor blowout is therefore fundamentally connected to the perpendicular wind speed and measurements of conductor blowout provide information about the perpendicular wind speed experienced by a given transmission line span.

The maximum amount of electrical current a conductor cable can sustain without breaching a predetermined maximum conductor temperature is known as the thermal conductor rating, the ampacity, or simply the "rating". The thermal rating of a conductor is a function of the electrical and material properties of the conductor, as well as environmental factors that can heat or cool the conductor such as: heating from absorption of solar radiation, radiative ("black-body") cooling of the conductor, the temperature of the ambient air relative to the temperature of the conductor, and cooling from forced convection (e.g. wind) that carries excess heat away from the conductor. Thermal ratings are traditionally calculated using assumed static values for environmental variables associated with "worst case" annual or seasonal conditions. By accurately measuring the changing environmental factors that heat and cool the conductor, it is possible to calculate a Dynamic Line Rating (DLR), or more specifically a Dynamic Thermal Line Rating (DTLR), that reflects the actual conditions affecting the temperature of the conductor. A DLR can often have a higher conductor ampacity than what can be calculated in the absence of accurate weather information concerning solar, ambient temperature, and wind cooling information due to the conservative nature of the assumed values of these variables. Among these factors, forced convection cooling from wind is typically the most important and sensitive variable for computing dynamic line ratings.

One source of weather information are weather station anemometers. There are many forms of anemometers for measuring wind speed and direction. Among the various forms of anemometers, the most commonly used for weather station networks are mechanical cup-and-vane anemometers and ultrasonic anemometers.

Another source of weather data comes from National Centers for Environmental Information. This entity provides coarsely-gridded numerical weather prediction models that are useful for predicting regional and global weather.

SUMMARY OF THE INVENTION

One shortcoming of the weather station anemometers is that they collect point measurements of the local wind speed and direction, which may not be characteristic of the average overall wind field experienced by a nearby conductor span, which might extend to 1,000 meters or more in length. The point measurement of an anemometer samples a localized wind speed and direction that is overly sensitive to perturbations from nearby obstacles such as buildings, local ridge and valley topography, or vegetation growth along a power line right of way. If point-location weather stations are mounted on transmission tower structures, the lattice or monopole structure of the tower itself may cause perturbations in the fluid flow of the wind field and lead to incorrect conclusions about the convective cooling available to the overall conductor span.

Additionally, estimating the average wind field experienced by a conductor span is not well-estimated by the coarsely-gridded numerical weather prediction models. These coarsely gridded weather models are too sparsely spaced and too insensitive to the effects of topography and vegetation to give an accurate estimate of the localized wind speed and direction for the microclimate experienced by a given conductor span. In contrast, wind speed and direction information derived from the horizontal blowout displacement of a hanging conductor gives accurate information about localized convective cooling wind speeds averaged over the spatial extent of a conductor span, but without the drawbacks of an overly-localized weather station anemometer point measurement that may be biased by immediate proximity effects, and in contrast to an overly-coarse numerical weather prediction model that does not capture enough localized effects on wind speed and direction. The blowout-derived perpendicular wind speed is therefore averaged over a spatial scale that is well-suited for determining the effective cooling wind speed for calculating dynamic line ratings for a conductor span based on field observations.

It is therefore desirable to find a method for determining the effective cooling wind speed for a conductor span for the purposes of computing a dynamic line rating. To that end, the invention concerns methods and systems determining the mechanically- and spatially averaged perpendicular wind speed on an electrical transmission line span based on measurements of blowout of the conductors.

Moreover, in conditions with turbulent or gusty winds, conductor blowouts may not be sustained and may be erratic or inconsistent. In these cases, continuous observation of the motion and/or path of the conductor, including maximum displacements to either side, RMS or time-averaged displacements, can serve to create a measure of a time-averaged effective wind speed.

In general, according to one aspect, the invention features a method for estimating wind speeds around transmission lines. The method comprises constructing statistical correlations between measured conductor blowout and wind speeds for spans of the transmission lines, generating local wind speed scaling coefficients, and using the wind speed scaling coefficients to estimate wind speed for spans from forecasted wind speeds.

The forecasted wind speeds could be derived from Numerical Weather Prediction (NWP). Also constructing the statistical correlations can include using measured blowout-derived wind speeds and measured wind speeds for same timestamps.

Statistical analysis using wind data can be grouped by wind direction. Also, the grouping by wind direction can be based on a several, such as twelve, sectors.

In some examples, the local wind speed scaling coefficients are seasonally adjusted. Another option is to assess local vertical wind speed profiles.

Preferably, the conductors are measured with optical clearance sensors such as light detection and ranging (LIDAR) sensors and/or camera-based sensors.

In addition, encroachment can be measured and the system can be used to provide a ground truth weather assessments.

In general, according to another aspect, the invention features a system for estimating wind speeds around transmission lines. The system comprises sensors for measuring conductor blowout, anemometers for measuring wind speeds. A computer system the constructs statistical correlations between measured conductor blowout and wind speeds for spans of the transmission lines, generates local wind speed scaling coefficients, and uses the wind speed scaling coefficients to estimate wind speed for spans from forecasted wind speeds.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 3A is a flow diagram illustrating the operation of the blow-out derived anemometer;

FIG. 3B shows a mechanical derivation of wind-induced blowout, assuming a simple pendulum model for the hanging conductor;

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Also, all conjunctions used are to be understood in the most inclusive sense possible. Thus, the word "or" should be understood as having the definition of a logical "or" rather than that of a logical "exclusive or" unless the context clearly necessitates otherwise. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
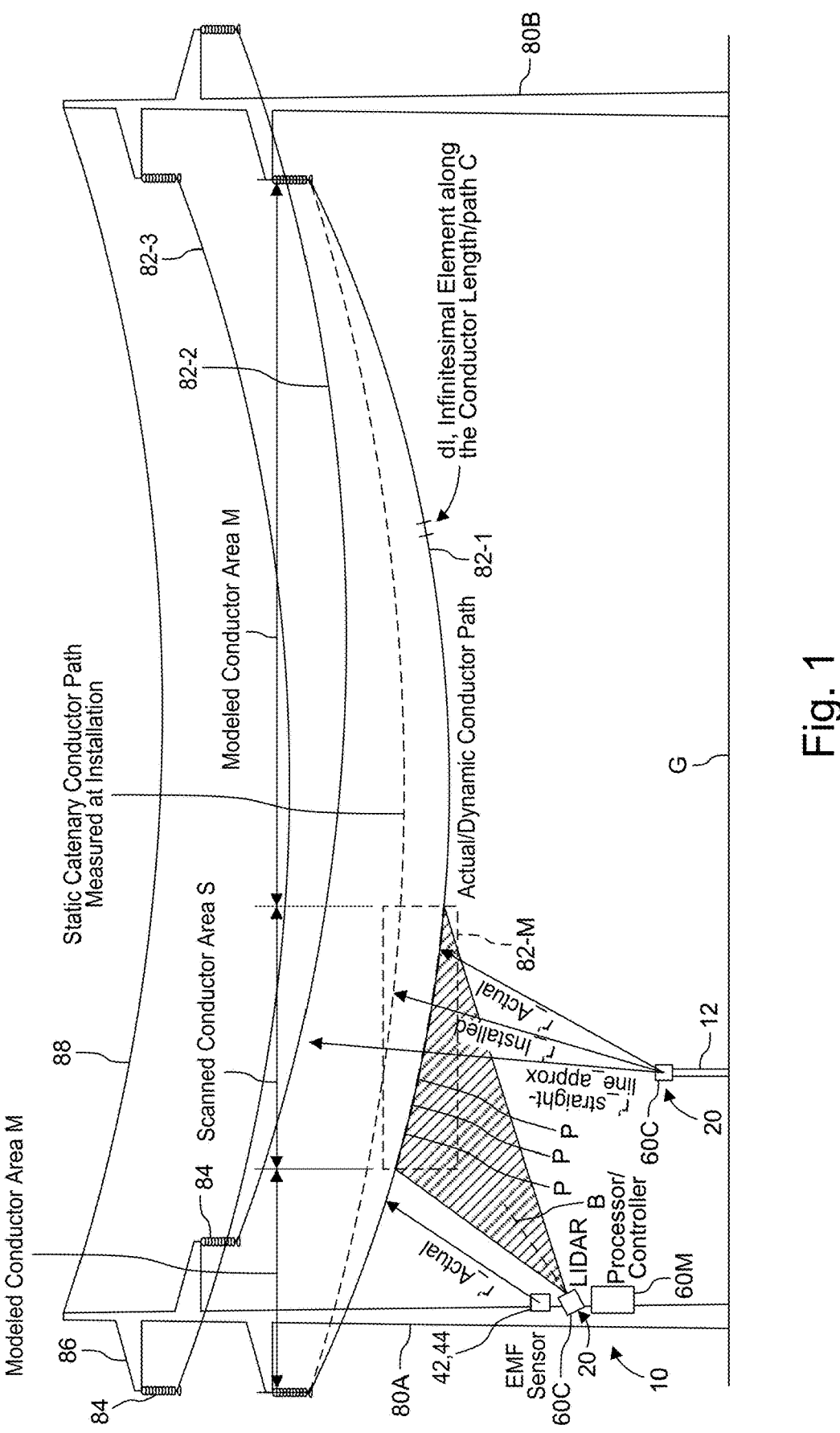
FIG. 1 is a schematic view showing transmission line towers carrying a transmission line span including a transmission line monitoring system.

FIG. 1 shows exemplary transmission line towers 80A, 80B supporting a span of three conductors 82-1, 82-2, 82-3 of a power transmission line. The conductors are hung from insulator strings 84 that connect to insulator supports 86 of the tower 80. Commonly, an overhead ground wire (OHGW) 88 is also provided for lightning protection, for example.

A transmission line monitoring system 10 is provided that monitors the geometry of conductors 82 with clearance sensors 20. In the illustrated example, the transmission line monitoring system 10 is deployed in a main enclosure 60M, which includes a controller 50 and possibly a power system. An additional one or more sensor enclosures 60C are also often provided for the one or more clearance sensors 20. The sensor enclosure(s) 60C are connected to the main enclosure 60M typically with weatherproof wiring harnesses providing control, data transfer and power.

In some examples, the transmission line monitoring system 10 might further include sensors for monitoring the electricity carried by the conductors. Optional EMF sensors 42, 44 might be mounted to the tower 80 to monitor the electromagnetic field (EMF) around the conductors 82.

Often a sensor articulation system mounts to the tower 80, or a nearby separate mounting pole or other structure 12, and carries the clearance and/or EMF sensors 20 of the transmission line monitoring system 10. Preferably, the sensor articulation system includes adjustable angle brackets, sliding mounts, rotating mounts, and other position-adjustment mechanisms that enable the clearance sensors 20 to be aimed accurately at the overhead conductors/wires given a variety of ground-based or tower-based mounting locations and mounting types (pole, cabinet, vault, wall, roof, power transmission structure base, tripod, etc.). The articulation system may be adjusted and fixed in place once at installation or again during maintenance, or continuously and autonomously adjusted by motors or other electromechanical devices. In general, the sensor articulation system is installed on a transmission structure pole/leg at a distance often no greater than 35 meters and typically between 10 and 50 meters, line of sight distance, from the monitored conductors 82. The articulation system often allows the boresight B of the clearance sensor system 20 to be aimed upward at the conductors. Specifically, the clearance sensor system 20 is angled to scan the conductors between 30 degrees and 90 degrees above horizontal.

In addition, as shown, the clearance sensors 20 are mounted to the tower 80 and/or on another structure 12 such as a pole located in the regions between towers.

In the illustrated example, the clearance sensor 20 detects the position of all of the conductors 82-1, 82-2, 82-3, and OHGW 88. The figure shows the scanning of the exemplary conductor 82-1 within the scanned conductor area S. The points P in box 82-M represent actual measured data from the scanning of the clearance sensor 20. These points are used to extrapolate the conductor into the modeled conductor areas M on either side of the scanned conductor area S.

Figure 2:
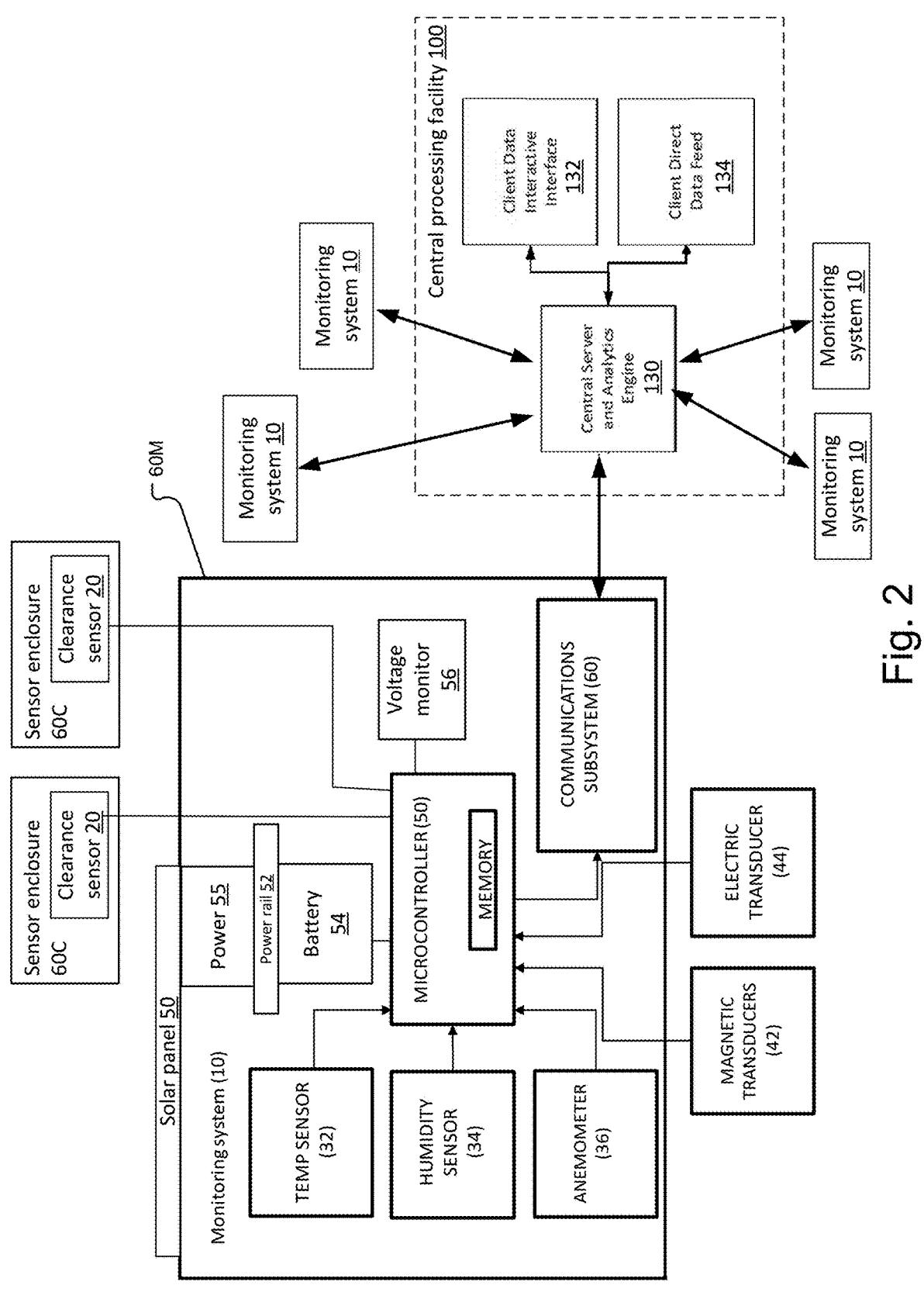
FIG. 2 is a schematic diagram showing the transmission line monitoring systems communicating with a central processing facility.

FIG. 2 is a block diagram showing the transmission line monitoring system 10 along with its central processing facility 100.

Typically, the monitoring system 10 will be powered by a rechargeable battery 54 that is located within the main housing 60M or a separate housing. Power from the battery is distributed to the electronic components of the monitoring system 10 such as a microcontroller 50 via a power rail 52. In a preferred embodiment, the battery 54 is recharged by a solar panel 50, electrochemical fuel cell, and/or mains power supply where available. A power management system 55 controls the charging of the battery 54 and possibly conditions the power delivered to the system's components. Typically, the power management system 55 also distributes the power to the clearance sensors 20 and EMF transducers 42, 44, if present, via the respective wiring harnesses. A battery voltage monitor 56 monitors the voltage of the battery 54 and passes this information to the controller 50.

The monitoring system 10 includes the one or more clearance sensors 20, typically installed within separate sensor housings 60C for detecting the position of one or more conductors 82 of the power transmission line. In most embodiments, the one or more clearance sensors 20 are positioned at a predetermined initial distance from, but not in physical contact with, the one or more conductors 82. The one or more clearance sensors 20 are then mounted at or near ground level under the power transmission line or on structures (e.g., pole, tower leg) that are near but not in electrical contact with the conductors of the power transmission line. By not requiring direct electrical or mechanical contact with the conductors, the clearance sensors 20 may be placed in a greater variety of positions, and do not compromise or otherwise impact the mechanical or electrical integrity or behavior of the monitored conductors.

Multiple types of clearance sensors 20 may be used and incorporated into the transmission line monitoring system 10 for this purpose, including, but not limited to: (i) Frequency Modulated Continuous Wave (FMCW) RADAR sensors; (ii) laser rangefinder or LIDAR sensors, which relies on laser pulses and time-of-flight (ToF) analysis; (iii) ultrasonic rangefinder and/or level-detection sensors, which emit a high-frequency sound pulses and then listen for the reflection of the pulses off of the target object; and (iv) cameras or other optical sensors. Attachment of additional hardware (e.g. reflector targets, RF resonators, RFID tags etc.) to the monitored conductors is typically not necessary, as each sensor type can detect the position of an unmodified conductor although they can certainly be used. Modification of the surface coating of the conductor performed in special circumstances to alter the optical properties of the conductor surface to improve sensor signal quality.

The microcontroller 50 of the transmission line monitoring system 10 receives the data from the one or more clearance sensors 20 executes instructions stored in a memory component or other computer-readable medium to perform certain conditioning operations on the received data from the one or more clearance sensors 20 to generate a digital data stream. Generally, the microcontroller 50 is a computer system implemented on a compact integrated circuit that includes a processor, memory and input/output (I/O) peripherals on a single chip. In other examples, a more general controller could be used such as a 'single board computer' style controller could be used in which one or more microprocessors) memory, input/output (I/O) and other features required of a functional computer are implemented on a common board.

The resultant digital data stream is then analyzed to, among other things, (i) determine a position of the one or more conductors of a power transmission line, and then (ii) determine the height of each of the one or more conductors relative to an underlying ground surface, (iii) the motion and horizontal displacement of one or more conductors from a hanging rest position ("blowout"), and (iv) the minimum inter-conductor distances in cases where multiple conductors are present. Of course, such analysis is preferably achieved through the use of a digital computer program (i.e., computer-readable instructions executed by a processor of a computer) that includes appropriate modules for executing the requisite instructions (which are stored in a memory component or other computer-readable medium). As described below, such analysis can be carried out at a central server system and analytics engine 130, or, in some embodiments, such analysis may be carried out locally via the microcontroller 50 or another computer or the processing can be distributed between two or more of these computers.

Generally, the microcontroller 50 is a microprocessor, processor implemented in a field programmable gate array (FPGA), or other computer-based system 50 that collects digital and analog sensor data streams and organizes the resulting digital data, performs basic signal conditioning and logical operations based on sensor data values/quality, and then assembles data for transmission to the central processing facility 100. The microcontroller 50 is also capable of receiving reprogramming or re-parameterization instructions from the central processing facility 100 when a sensor or analysis configuration changes are required. Configuration adjustments may be accomplished by human analyst action, or by automated algorithmic means based on system calculation results. The conductor geometry data is then communicated to interested parties, or the determined conductor geometry data can be used in subsequent calculations and analysis, as further described below.

The transmission line monitoring system 10 also preferably includes certain auxiliary sensors for sensing or measuring environmental conditions in the vicinity of the power transmission line, including, for example, a temperature sensor 32 for sensing ambient air temperature, a humidity sensor 34 for sensing the humidity level of the air, and/or an anemometer 36 for detecting wind speed.

Data from all such auxiliary sensors, whether environmental data and/or operational data, is also communicated to and received by the microcontroller 50, which again preferably executes instructions stored in a memory component or other computer-readable medium to perform certain conditioning operations on the received data. The data from these auxiliary sensors, alone or in combination with the data from the clearance sensors, can then be used as part of a refined analysis of the conductors of a power transmission line, as further described below.

The transmission line monitoring system 10 also includes a communications subsystem 60 for transmitting data. Such a communications subsystem 60 may be comprised of one or more modems, radios, communication cables, local data ports, or other suitable means for transmitting data. In this exemplary embodiment, it is contemplated that the communications subsystem 60 would transmit the conditioned data from the microcontroller 50 to the central processing facility 100 and specifically its central server system and analytics engine 130 (which also may be termed a "central server and analytics engine"), where the final steps of determining the position of one or more conductors of the power transmission line and determining an approximate height of each of the one or more conductors relative to an underlying ground surface G would be carried out.

Generally, the communications subsystem 60 comprises one or more wireless modems, transceiver radios, communication cables, or local data ports (e.g. USB) used to transport data from the microcontroller 50 to central server 130 or a portable computing device, laptop computer, of a technician. Cellular and satellite modems, and licensed and unlicensed radio modems are example manifestations of the communications subsystem. The communications subsystem is typically two-way, and is capable of encrypted or encoded data transmission for security and data privacy purposes.

In more detail, the communications subsystem 60 includes one or more onboard cellular and/or satellite modems transmit sensor data to the central processing facility 100, where additional advanced analytics and monitoring process analytics are performed. Preferably a cellular modem is used. Various third-party cellular modem modules/gateways are configured for global use on major carrier networks. Another option is a satellite modem: For certain remote deployments outside of cellular network coverage, Iridium® or Starlink satellite communications equipment can be specified. In addition, antennas such as omnidirectional and/or directional (e.g., Yagi) antennas are part of the communication subsystem 60. Typically, they are specified to suit local signal strength and direction requirements. Additional options are the ISM bands (e.g. 900 MHz) or licensed-band private radio communications.

Furthermore, as mentioned above, the transmission line monitoring system 10 not only allows for determination of the height of one or more conductors of a power transmission line, but it also allows for the continuous and real-time monitoring of other properties of the conductors and their environment that inform human observers about the performance, safety, and material condition of the power transmission line. The most common manifestation of actionable real-time performance information is in the computation of the Dynamic Line Ratings (DLR), which represent maximum hypothetical current loadings on the conductors, in response to weather conditions, above which conductor overheating may occur. By calculating a DLR that is based on real-time operating conditions and conductor performance, more-accurate ratings can be used and factored into scheduled power market generator dispatch, enabling increased use of existing transmission capacity. Furthermore, long-term monitoring of conductor sag, temperature, current loading, and mechanical cycling can help asset owners decide whether conductors can be operated more aggressively than previously assumed, or whether they are reaching end-of-life due to mechanical stresses and associated material degradation (e.g., creep, corrosion).

A number of different technologies could be employed to implement the clearance sensor(s) 20. This sensor function can be manifested as one or more of a suite of sensor types sharing the common capability of measuring the height of a substantially horizontal conductor above the ground, or another fixed point of reference relative to the wire/conductor. Overhead conductor heights are measured within distance of 5-100 meters, typically, with desired accuracy of 1-2 centimeters (cm). These sensors are intended to be placed on fixed-position mounts at or near ground-level, or on structures (e.g. pole, tower leg) that are not in electrical contact with energized overhead wires. Conductor clearance can be referred to inversely as conductor sag, or the displacement of a hanging conductor below the fixed mounting points on either end of the hanging wire assembly.

In one implementation, the clearance sensor 20 is a FMCW Radar (Frequency Modulated Continuous Wave Radar) sensor. This type of device is typically used for level-detection and ranging of solids and liquids in silos, tanks, pools, etc. Other technologies can be used such as laser rangefinder devices, laser object detection devices, and/or visible and/or infrared cameras.

Blowout-Derived Anemometer

FIG. 3A is a flow diagram illustrating the operation of the blow-out derived anemometer.

In step 608, a collection of single-shot or repeated scan or image data of the monitored conductors 82-1, 82-2, 82-3, and OHGW 88 is obtained. This is processed along with geometric information about the position and orientation of the of the clearance sensor. Additionally, the spatial location of conductor mounting points on transmission line towers, allows the scan data to be calibrated and transformed into a measurement of horizontal blowout of the conductor.

For each physical sensing method, appropriate filtering and post-processing is performed on the raw sensor data, either by the clearance sensor 20, the microcontroller 50 or the central server 130 or by other downstream computer processing onboard the device, to obtain the most accurate range or position measurement, account and compensate for noise and bias, and detect and correct for data or signal artifacts characteristic of the physical sensing method.

In one example, the information from the clearance sensors 20 is used to generate three-dimensional coordinates in either spherical or cartesian form, and also preferably includes radial doppler velocity measurements associated with each point. This is used to generate point clouds in step The point coordinate clouds are analyzed for example by the microcontroller 50 and/or central server and analytics engine 130 as described in connection with FIG. 2 to remove noise, bias, artifacts and are then clustered or grouped into sub-clouds associated with each of the monitored conductors 82-1, 82-2, 82-3, and OHGW 88 in step 612.

In many implementations, due to logistical and range limitations, it is not feasible to install the clearance sensors 20 in a location where they can scan and capture the point of greatest horizontal blowout near the middle of the span. Instead, a partial scan of the catenary cable length is captured, and the points are fitted in the lateral plane using a parabolic or other polynomial fit to determine the horizontal displacement at the point of greatest blowout in step 613.

In step 614, the timestamp and/or Doppler velocity data associated with each conductor- or target-specific point clouds are then analyzed to determine if the target is stationary or in motion by the microcontroller 50 and/or central server and analytics engine 130.

In addition, in some examples, the conductors are analyzed for safety. It is confirmed whether the conductors extend beyond certain distance limits and encroach on vegetation in a right of way.

In step 616, for targets that are in motion, additional analysis is performed to characterize the motion, including velocity, period/frequency of swinging motion, and minimum and maximum displacement metrics by the microcontroller 50 and/or central server and analytics engine 130.

These steps are repeated if additional scan data collection is determined to be useful. This happens if the motion characterization is indeterminate, and the characterization analysis is iterated under control of the microcontroller 50 and/or central server and analytics engine 130.

In some embodiments, visible or infrared video cameras are employed as the clearance sensors 20 to capture periodic still images and video of the overhead conductors 82-1, 82-2, 82-3, and OHGW 88. In this embodiment, a flash or illuminator array is used to extend the imaging function of the device into nighttime periods where sunlight is unavailable. The onboard processing capabilities are used to dynamically adjust exposure/shutter, frame rate, focus, and gain settings of the camera subsystem, and downstream processing of the received images and video automatically adjust contrast, brightness, color balance, and other image parameters so that the target conductors can be resolved optimally by object recognition algorithms. This processing is typically performed by the microcontroller 50 and/or central server and analytics engine 130.

Preferably, the camera subsystem of the clearance sensor 20 is calibrated during manufacture and the lens distortion parameters measured and stored, so that lens and image sensor distortion effects can be removed by the microcontroller 50 and/or central server and analytics engine 130 for each image captured by the camera subsystem.

The onboard processor of the camera subsystem preferably executes algorithms that associate image regions with target objects and then characterizes their geometry. In the case of overhead conductors, edge-finding and line-finding algorithms (e.g., Hough transform) are used to isolate conductor objects typically by the microcontroller 50 and/or central server and analytics engine 130. From these pixel-level data associated with each conductor, additional photogrammetric analysis is performed to determine the position, blowout, sag, and clearance of the conductors within the field of view of the camera.

In order to compensate for either tower structure or camera subsystem movements due to wind, earthquakes, or incidental contacts/impacts, the camera subsystem is preferably configured with a suitable wide field of view (FOV) that is able to capture the towers themselves, and the fixed clamping points of the conductors and/or insulators. With this wide FOV capability, the method used to compute wind speed from observed blowout will not be compromised by a minor displacement or rotation of the camera caused by some incidental contact (e.g., bird, frisbee, falling branch), as long as the tower endpoints remain in the FOV. Tower or insulator motions in response to wind forces or tension forces from conductors may also complicate the blowout analysis, and are accounted for using the wide FOV method described herein.

In another embodiment, one or more single-channel laser rangefinders or laser obstruction detectors are employed as the clearance sensors 20 to monitor conductors 82-1, 82-2, 82-3, and OHGW 88. Such devices often do not rely on time-of-flight or modulation techniques to determine the distance of an object struck by the laser pulse. These sensors are employed in a fixed configuration that detects conductor blowouts beyond a given threshold of displacement. In some cases, the lasers are arranged in a narrow fan pattern (e.g., 1 degree angular width) or in a parallel "fence" arrangement (e.g., 10 centimeters apart) to capture significant conductor blowouts using a simpler and more energy- and processing-efficient manner as compared to a scanning LIDAR or camera. The data collected by these sensors preferably includes the detection, duration, count, and frequency of conductor excursions beyond a given displacement or angular displacement, which can be mapped to mechanical models of blowout to determine an incident wind speed on the monitored conductor by the microcontroller 50 and/or central server and analytics engine 130.

In another embodiment, millimeter-wave radar range-finding sensors are employed the clearance sensors 20 to detect the distance, motion, and displacement of the overhead conductors 82-1, 82-2, 82-3, and OHGW 88. Special processing and filtering of the radar returns will be required to account for the unique characteristics of the radio frequency reflections generated by the catenary shape of the overhead conductor and the helical arrangement of the conductor strands, which may be circular or trapezoidal in cross-section. Measurement of the conductor blowout will require placement of the radar device at a location with substantial horizontal distance from the overhead conductor, so that horizontal motion of the conductor caused by blowout can be resolved along the directional or range axis of the radar beam.

Mechanical Model in Steady Winds

FIG. 3B shows the mechanical derivation of wind-induced blowout, assuming a simple pendulum model for the hanging conductor. The blowout of the conductor is defined as the maximum horizontal displacement of the conductor relative to the "dead hang" position.

In the case of steady winds with approximately uniform speed and direction, the mapping of a given blowout observation to an apparent wind speed is accomplished with a mechanical model that treats the hanging conductor as a simplified extended pendulum hanging from the two fixed endpoints of the span.

In steady-state conditions, three forces act on the conductors 82-1, 82-2, 82-3, and OHGW 88.

The horizontal force induced by the wind. This force is a function of wind speed, azimuthal direction of the wind, and the effective diameter of the conductor. This force component may be modeled more completely by considering the surface texture of the conductor, the aerodynamic effects of bundled sub-conductors, etc.

The gravitational force pulls the conductor downward. This force is a function of the mass (or mass-per-unit length) of the conductor. Generally, the gravity at the Earth's surface can be considered constant ($9.81$ m/s$^2$).

The tension of the cable, pulling the conductor up toward the tower suspension points. The transverse horizontal component of this tension across the right-of-way (as opposed to longitudinal horizontal tensions along the length of the cable) will serve to balance the horizontal force induced by the wind. The vertical component of this tension will counteract the force of gravity.

Figures 4A, 4B:
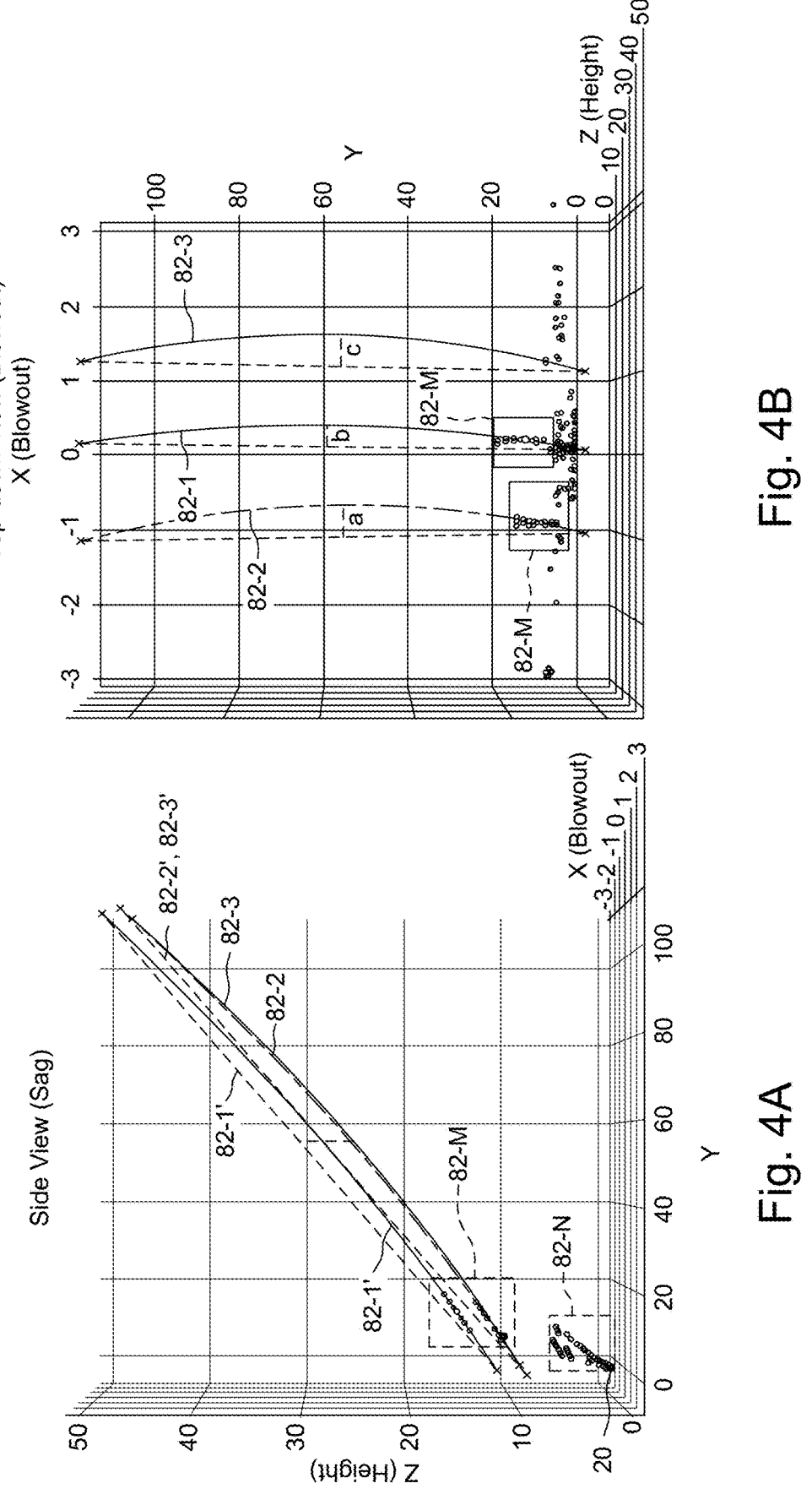
FIGS. 4A and 4B are plots of three conductors in the y-z plane and the y-x plane, respectively, imaged using a LIDAR-based clearance sensor placed near ground level, and showing mathematical lines-of-best-fit that model and extrapolate the conductor shape from actual measured point cloud data.

FIGS. 4A and 4B plot the LIDAR clearance sensor data for the example of three-phase transmission circuit conductors imaged using a LIDAR sensor placed near ground level. Note, the data was collected from an inclined span that ascends a mountain. FIG. 4A plots the data in the y-z plane, and FIG. 4B plots the data in the x-y plane, in which the z-axis represents height, the y-axis runs horizontally along the length of the conductors, and the x-axis is the lateral direction.

The points in box 82-M represent actual measured data from the scanning of the LIDAR clearance sensor 20. These are discrete points illustrating the three-dimensional point cloud measurements collected from the multi-channel LIDAR, in which each channel scans at a fixed elevation angle relative to the rotation axis of the spinning LIDAR.

The points in box 82-N represent points detected by the scanner that are not associated with the desired conductor measurements. These points are disregarded as noise.

The lines 82-1, 82-2, 82-3 represent the positions of the conductors extrapolated from the measured data and the known attachments points for the conductors using curve fitting of a catenary (hyperbolic cosine) function. The lines have been fitted to the measured points 82-M using a non-linear least-squares fitting operation. Least-squares fitting of a linear approximation of conductor shape is also possible, and non-linear fits may include catenary, parabolic, higher-order polynomial, or others, mathematical approximations of the true shape or path of the conductor. Conductor shape models may also be created to reflect standing-wave or other dynamic shape characteristics of a conductor in motion.

The dotted lines 82-1', 82-2', 82-3' represent the hypothetical zero-sag positions of the conductors, forming a straight line between insulator mounting positions.

Figure 5:
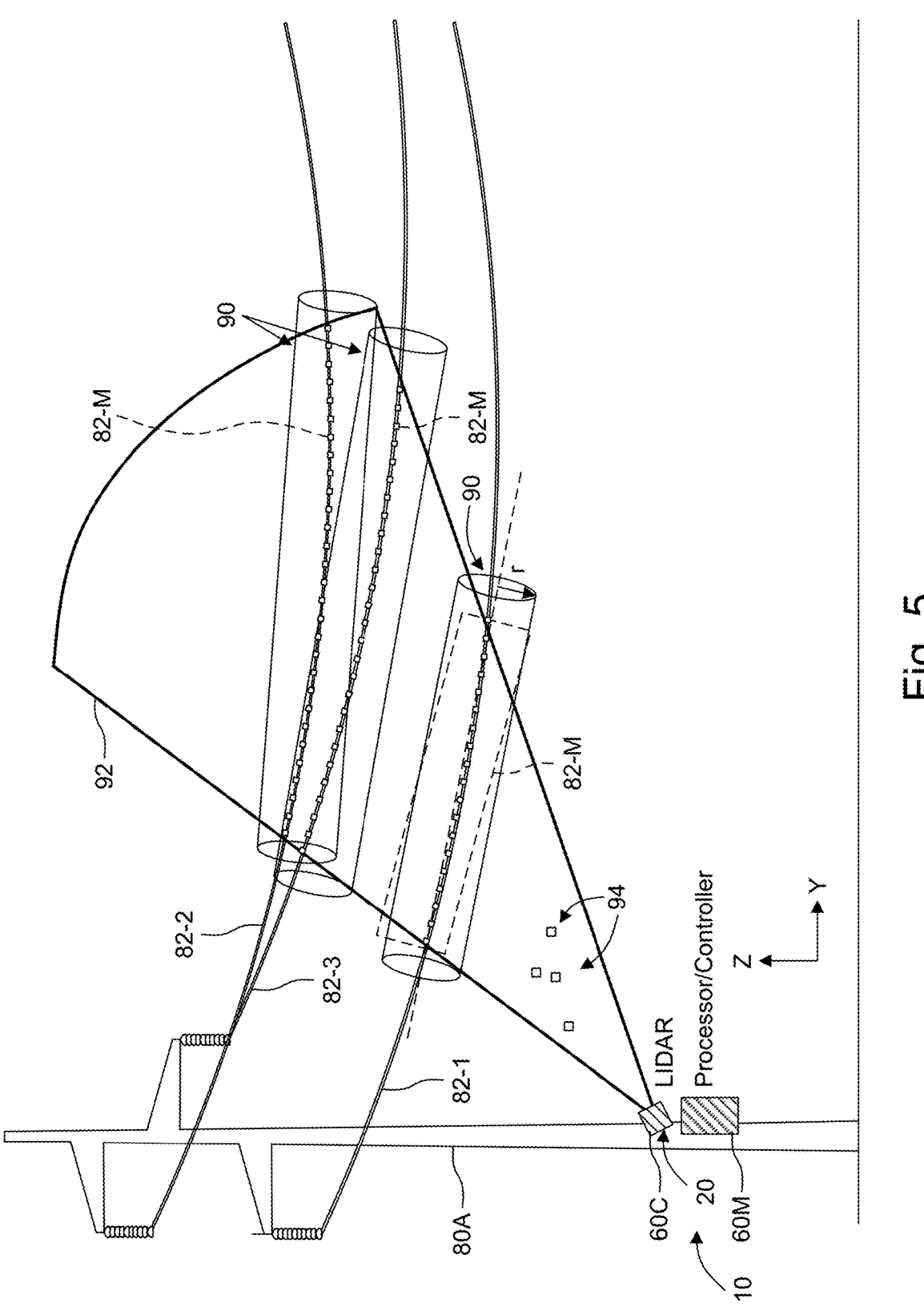
FIG. 5 is a schematic view showing a transmission line tower carrying a span and being monitored by the transmission line monitoring system showing a conductor search scheme employed by the controller of the system.

FIG. 5 illustrates how the controller 50 uses the measured points 82-M corresponding to each of the conductors 82-1, 82-2, 82-3 to resolve the position of the conductors.

In more detail, typically during an initial configuration process, exclusive three dimensional search regions 90 are defined for each of the conductors 82-1, 82-2, 82-3 within the volumetric region 92 that is scanned by the LIDAR clearance sensor 20. Generally, the volumetric region 92 may be configured to scan angles between 30 degrees and 90 degrees above horizontal.

In the illustrated embodiment, these search regions 90 are cylinders that are centered on the anticipated locations of the respective conductors 82-1, 82-2, 82-3.

Generally, these regions 90 may be described by a cylinder, box, or radial distance from a pre calculated or last measured catenary path. In other examples, the regions are defined by a range within a spherical coordinate system. The search regions may be expanded or the regions translated algorithmically by the controller 50 when a suitable conductor is not found or the detected and fitted points sit near the edge of the original search region. This conductor location process may also be performed using advanced analytical processes, for example, computerized pattern recognition, to identify line or catenary shaped patterns in arbitrary point clouds without a preconfigured search region.

Generally, the algorithm should be robust against false returns attributed to snow, rain, dust, leaves, or birds 94 that are also detected as random points that lie within the volumetric region 92 and should be ignored in the conductor fitting process.

In one example, a Hough transform, or other computer pattern-recognition method is employed to find imperfect instances of objects (power line conductors) within a certain class of shapes (catenary shapes) by a voting procedure. The search regions may also be dynamically generated by the controller 50 based on previous results or internal logical operations. Preferably if it did not find enough points, then it expands the search radius.

Figure 6:
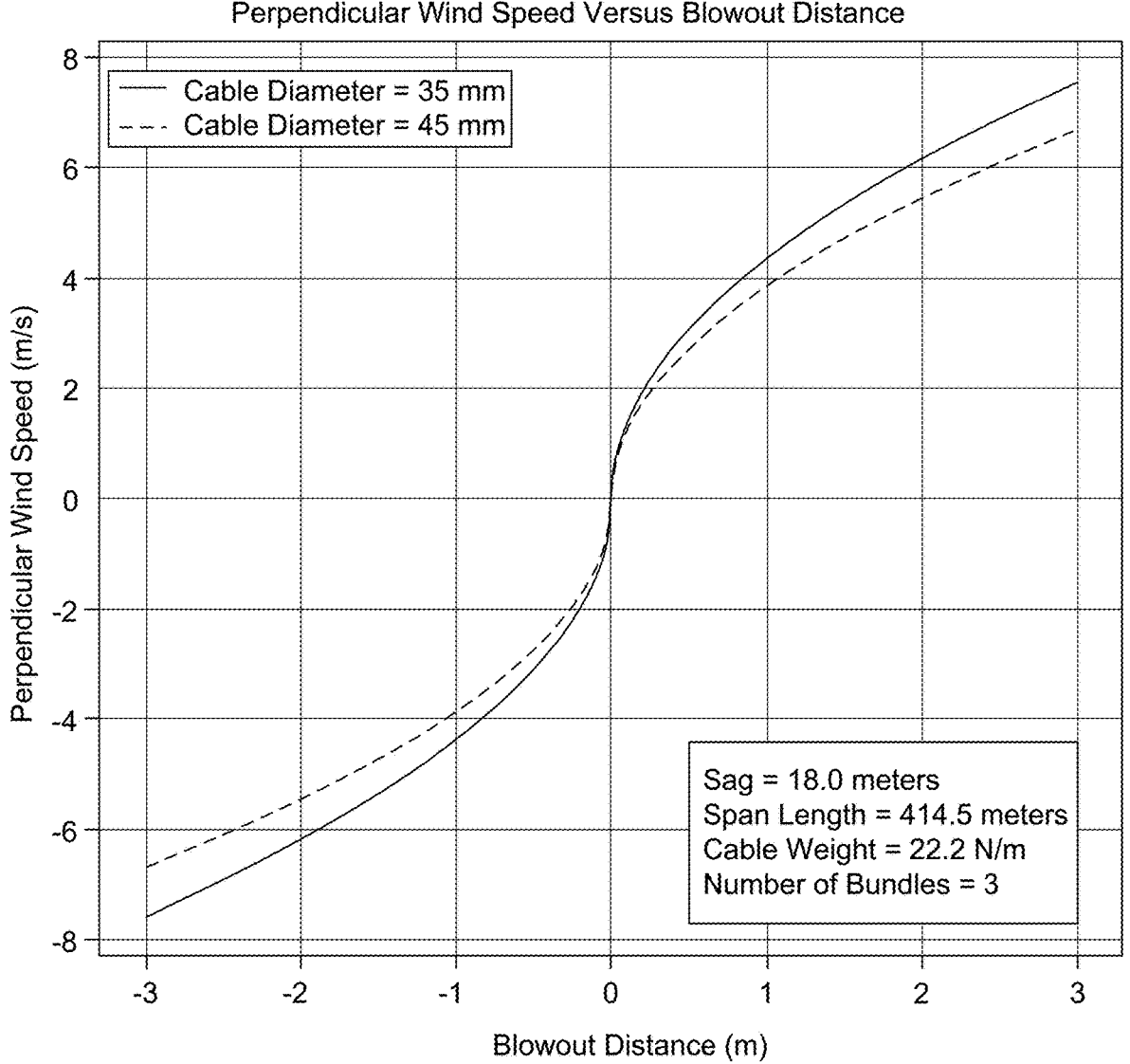
FIG. 6 are plots of the wind-induced blowout of two different conductor diameters for perpendicular wind speeds below 8 meters per second.

FIG. 6 are plots of the wind-induced blowout of two different conductor diameters for perpendicular wind speeds below 8 meters per second, using the mechanical model outlined in FIG. 3B.

In general, atmospheric wind flows are not steady laminar flows, and are instead unsteady turbulent flows consisting of many eddies and vortices of different length scales ranging from centimeters to kilometers. In practice, the long length of the conductor span, typically ranging from 100 to 900 meters, and the conductor's inertial resistance to motion will effectively spatially average and time average small gusting eddies in the turbulent wind flow field. Therefore the motion response of the conductor to gusty, turbulent winds will be to slowly oscillate around a mean (average) wind speed value, rather than hold steady at a single deflection angle.

Figure 7:
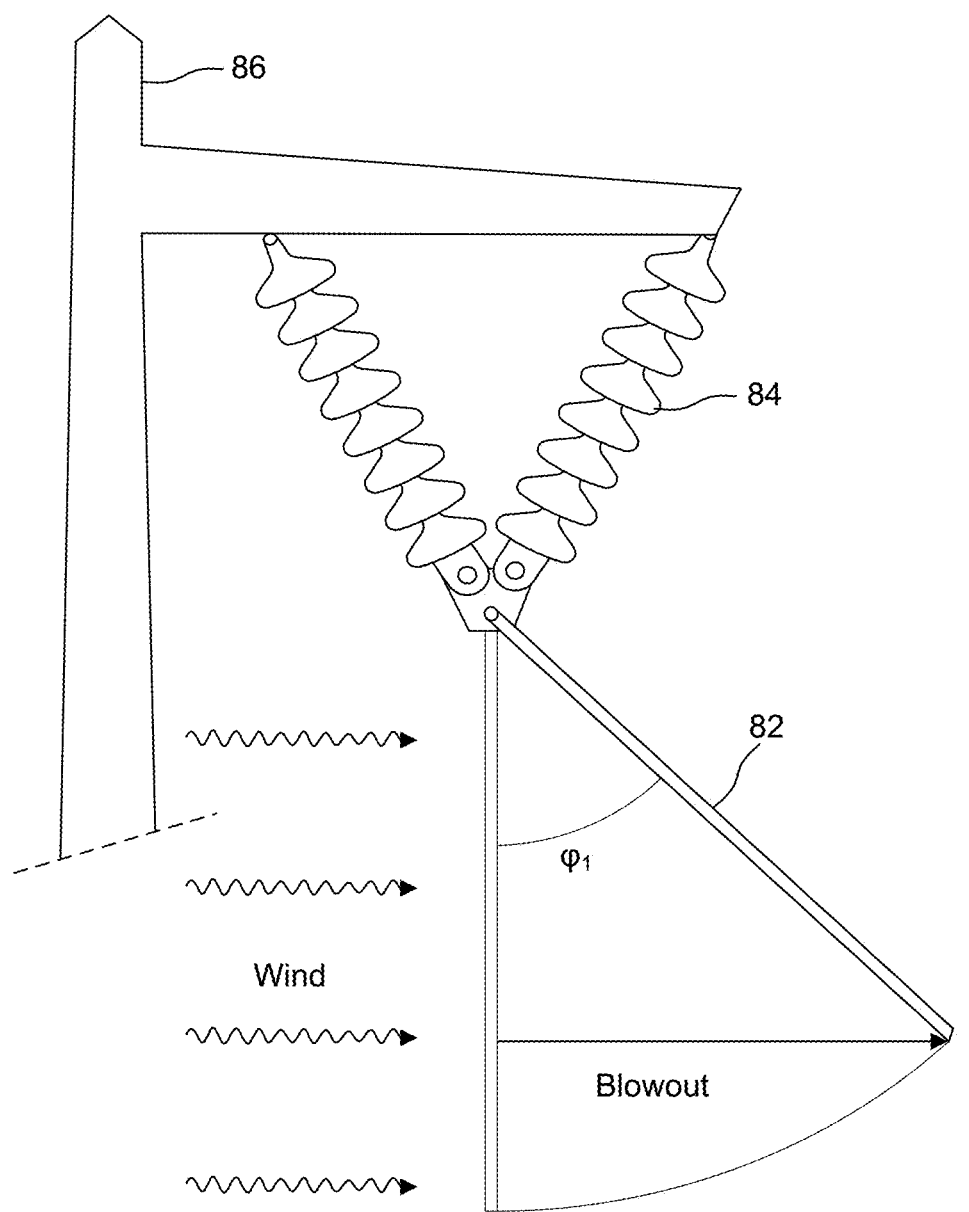
FIG. 7 shows a model for the conductor cable.

FIG. 7 shows the mechanical model of a rigid pendulum. This is a simplification of the actual physical system of a catenary cable on a real power transmission line. Additional refinements of the mechanical model that maps blowout measurements to perpendicular wind speeds include:

1. Refinements of the aerodynamic properties of the cable to account for the twisted helical form factor, and the aerodynamic properties of bundles consisting of two or more mechanically coupled cables.

2. Refinements of the mechanical model to compensate for motion of the freely-swinging insulator at the cable attachment points on the towers, the aerodynamic properties of the insulator itself, and to compensate for insulators of differing lengths, heights, types, etc.

3. Refinements of the mechanical model to account for the flexibility of the cable.

4. Refinements to model for a catenary shape exposed to a three-dimensional wind field where wind velocity increases with height above ground. The bottom of the catenary at lower heights above ground level is typically exposed to slightly slower wind speeds, than the ends of the catenary at the tower mount points at higher heights above ground.

Low Wind Speed Limit

The force induced by wind on the conductor is dependent on the square of the wind speed as discussed in connection with FIG. 3B. This means that small wind speeds produce comparatively smaller blowouts, such that there will exist a range of low wind speeds for which no significant blowout will be measured within the resolution of the measurement device. For optical clearance sensors 20 (LIDAR, camera, etc.), the pixel, angle, and distance/range measurement resolutions will factor into the blowout resolution limitations of the technique. The low-speed measurement limit can be characterized by determining the uncertainties of the optical subsystem(s), propagating these uncertainties through to the full-span blowout model, and then propagating them through to the calculation of wind speed. Based on empirical observation, moderate or greater wind speeds are present for significant fractions of the time such that the utility of the blowout-derived anemometer is not diminished beyond practicality.

The application of continuous monitoring as described often helps overcome snapshot measurements where the observed instantaneous blowouts are too low to overcome the low wind speed detection limit of the method. Intermittent conductor motions or excursions can be used to characterize turbulent conditions and produce a measure of the average or aggregate wind speed for the purposes of computing or validating a DLR.

Wind Direction Along vs. Across the Conductor

Blowout-derived wind speed anemometers are primarily sensitive to the perpendicular component of the average wind velocity vector, that is, wind that blows horizontally "across" the conductor.

Figure 8:
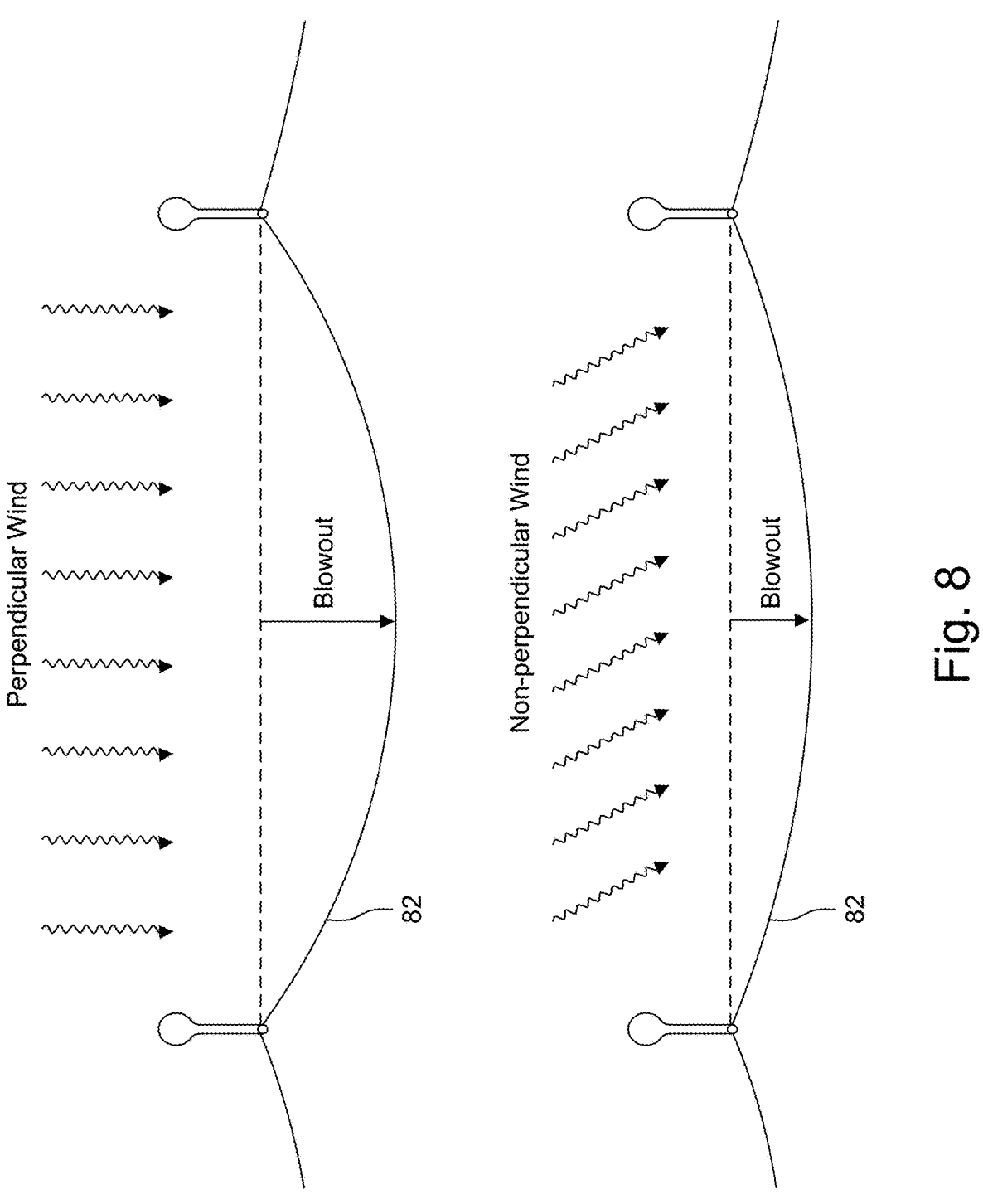
FIG. 8 is a schematic overhead view showing horizontal displacement of a hanging conductor due to wind forces ("blowout") for purely perpendicular horizontal wind that causes a large lateral displacement, or blowout compared to wind at a skew angle, but still with some perpendicular vector component, produces a smaller but still measurable blowout.

FIG. 8 illustrates the blowouts caused by purely perpendicular vs. semi-perpendicular winds.

In the illustrated top views, horizontal displacement of a hanging conductor due to wind forces ("blowout") for purely perpendicular horizontal wind causes a large lateral displacement. This compares with the blowout to wind at a skew angle, but still with some perpendicular vector component. It produces a smaller but still measurable blowout.

As a result, a single conductor span cannot easily provide information for wind velocity vectors that are primarily "parallel to" or "along" the length of the conductor. To obtain wind speed information for winds from all directions of the compass around a given span, it is necessary to monitor multiple adjacent conductor spans having different direction headings, ideally a pair of adjacent conductor spans forming a nearly 90 degree angle.

In the alternative, reasonable inferences can be made about the characteristics of the parallel winds based on the relative differences in topography and vegetation in comparison to the directly-measured perpendicular winds. For example, in the case where land on either side of a conductor right-of way is heavily forested, and the conductor right of way (along the conductor) is comparatively cleared of trees, it can be reasonably inferred that the perpendicular winds that are being probed by blowout anemometry are already sampling the "worst case" (slowest wind speed) direction, when considering the application of wind speeds for DLR.

Multiple Conductors Spaced Vertically, Shield Wires

In many cases, multiple phases of the same overhead transmission line circuit are arranged vertically, with identical conductors strung at heights that may differ by 10 meters or more.

In addition, most transmission circuits are accompanied by one or more OHGW or shield wires, which are lighter-gauge ground-bonded wires that serve to protect the energized conductors from lightning strikes by intercepting and guiding lighting to the tower legs and then to the ground below.

Conductors and shield wires at different heights within the same field-of-view of the optical scanning device(s) are preferably used to assess local vertical wind speed profiles, using the same blowout-to-wind-speed derivation described herein.

FIG. 1 illustrates the relative vertical positions of conductors 82-1, 82-2, 82-3, and OHGW or shield wire 88. Wind speeds often have a gradient that increases with height (although not always), with higher altitudes typically experiencing higher wind speeds due to lower frictional interaction with earth surface topography, vegetation, and built obstacles etc.

This wind speed height gradient can be used to overcome the low-speed detection limit of the blowout-to-wind-speed derivation method applied to lower conductors—upper conductors can be expected to move further in the higher wind speeds above, perhaps surpassing the minimum limit of detection.

Preferably, the wind speed characterized for the upper conductors is then mapped to a lower wind speed at the bottom-most conductor(s) using standard formulas for wind speed gradient vs. height, such as the logarithmic wind profile, as well as by examining the relationships between observed blowouts and wind speeds on all monitored conductors during periods of moderate or high winds. This analysis is typically performed by the microcontroller 50 and/or central server and analytics engine 130.

In general, the lowest-height conductors can be expected to experience the lowest wind speeds overall, and are therefore generally the limiting elements for the consideration of line-level DLR. Occasional inversions of the wind speed height gradient may be observed from time to time, which can aid in the study of wind dynamics as applied to DLR in the future.

Capturing the motion of the top-most shield wires extends the capability, as these wires often experience the highest wind speeds overall. And due to their light weight, they experience larger and thus more detectable horizontal blowouts than those expected of heavier phase conductors under the same wind conditions. Mechanical conductor models are then employed that account for differences in the conductor type/diameter, stringing tension and baseline sag values when comparing observations between shield wires and associated phase conductors.

Turbulence, Conductor Motion Capture

Figure 9:
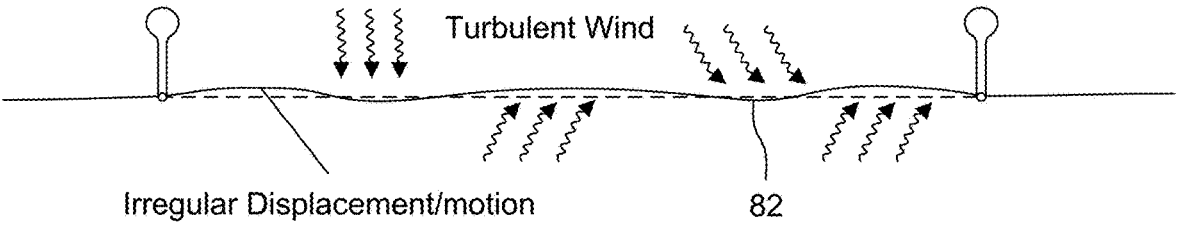
FIG. 9 a scenario in which winds are inconsistent or intermittent due to low wind speeds, turbulence, or gusts.

FIG. 9 illustrates the scenario in which winds are inconsistent or intermittent due to low wind speeds, turbulence, or gusts. A steady state "snapshot" observation captured on a fixed interval may not best represent the effective wind speed that describes the convective cooling potential of the present atmospheric conditions. The illustrated irregular conductor motions in response to turbulent or non-laminar wind speeds and direction are resolved using video and/or high-speed sampling/scanning of the conductor geometry. These motions may be periodic/harmonic or may be stochastic.

For the purposes of computing a dynamic thermal line rating, an average wind speed measurement that considers turbulence, gusts, and intermittent periods of rest often proves more beneficial and safer to use than snapshot measurement that relies on a steady-state wind speed assumption.

In these cases, the clearance sensors 20 are preferably configured to measure the three-dimensional position of the cable on a continuous basis, creating essentially a video stream in the application of an optical camera sensor as the clearance sensors 20, or a stream of point cloud data from a LIDAR clearance sensor. The microcontroller 50 and/or central server and analytics engine 130 then analyze the video stream for periodic and/or intermittent displacements of the conductor in any direction. From this analysis an assessment of the effective or net convective cooling effect of the turbulent winds is made. This analysis is performed by computer vision and/or computer point cloud analysis methods on the processor embedded within the apparatus. Examples of statistical properties that can be mapped to net effective wind speeds are the root-mean-square ("RMS") displacement of the conductor, the minimum and maximum displacements, the (temporal) frequency components of the displacement, etc.

Insulator and/or Tower Motion Capture

In cases where overhead conductors are mounted or suspended using suspension-type insulators, as is common in many jurisdictions, the insulators may also swing laterally in response to wind forces on the insulators, and on the attached conductors. In these cases, the total blowout displacement of the conductor relative to the "dead hang" zero-displacement position will be the sum of the displacement of the insulator and the conductor. Accounting for this additional displacement may be required when using the monitored blowout to calculate a wind speed.

Figure 10:
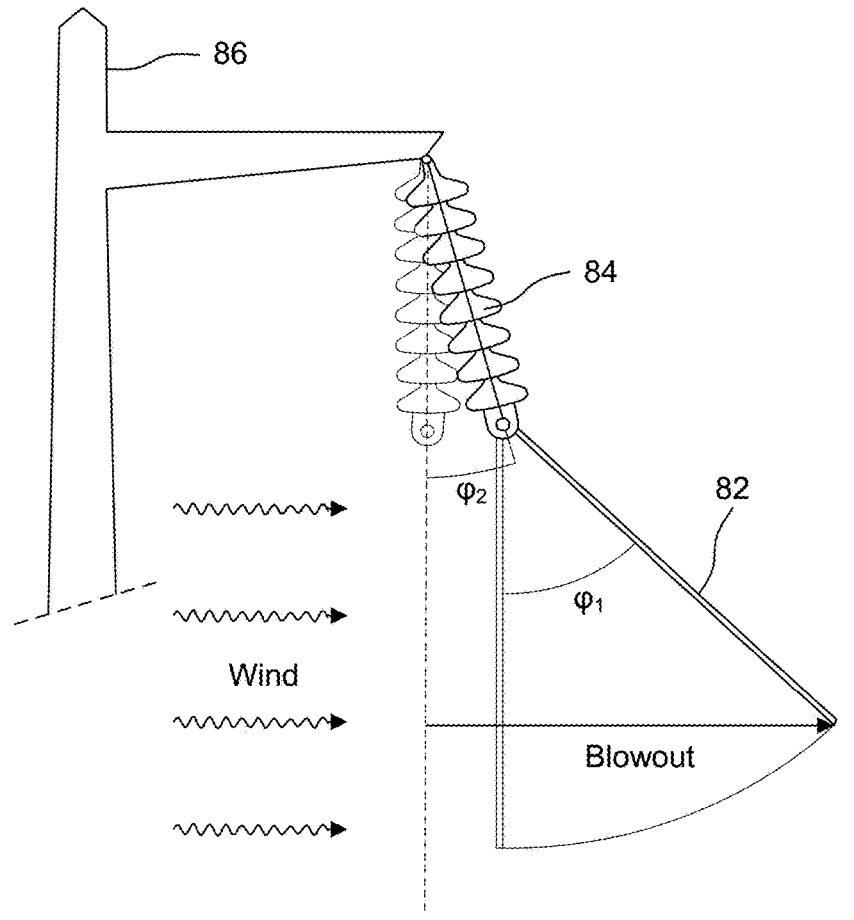
FIG. 10 shows the horizontal displacement of a hanging conductor and suspension insulator in a configuration where the insulator is permitted to pivot or swing about its fixture point.

FIG. 10 shows the horizontal displacement of a hanging conductor and suspension insulator in a configuration where the insulator is permitted to pivot or swing about its fixture point. In these cases, the mechanical model used to determine wind speed from blowout accounts for the aerodynamic and mechanical behaviors of the insulator in addition to the conductor.

The displacement or motion of the insulators can be modeled using standard mechanical analysis techniques. The weight, cross-section, flexibility of the insulators, and other factors may be considered in this model.

Additional sensors are used in some examples to detect and measure the blowout of the insulators directly. These sensors 20 may be LIDAR, laser rangefinder, visible or infrared cameras, or other sensor types. The same sensors used to monitor the conductor blowouts, can have sufficient field-of-view (FOV) to detect the insulator positions simultaneously with the conductor measurements.

Similarly, some transmission line tower structures, especially monopole structures, have considerable flexibility. These towers deflect in conditions of high winds, causing both forces directly on the tower cross-section, as well as forces communicated through the tension of the suspended conductors. Accurate modeling and/or direct sensor monitoring of tower deflection, again through the use of LIDAR, laser rangefinding, visual or infrared cameras, transforms measurements of conductor blowout to accurate determinations of wind speed. Sensors used for this purpose may be independent of those used to monitor the overhead conductors, or it may be possible to capture both the tower movements and the conductor movements within the same sensor's FOV.

Integration and analysis of the sensor measurement data associated with insulator, tower, and conductor movements into a mechanical/geometry model is performed by the processing hardware associated with the measurement device, or is performed by first sending raw data to a remote server via the communication modem, on which the mechanical analysis will be performed as would be performed by the microcontroller 50 and/or central server and analytics engine 130.

Application to Wind Re-Scaling Factors/Numerical Weather Prediction Model Adjustment Numerical Weather Prediction (NWP) models produce wind speed prediction outputs that are gridded with a spatial resolution of the overall model. For example, the NOAA North American Mesoscale Forecast System (NAM) calculates and produces outputs on a 12 kilometer (km)×12 km grid, and the NOAA High Resolution Rapid Refresh (HRRR) model calculates and produces outputs on a 3 km×3 km spatial grid. These coarsely gridded NWP models use coarsely gridded input topography elevation data, and aerodynamic roughness parameters from surface vegetation that are averaged over the entire multi-kilometer domain. Therefore, these coarsely gridded NWP models cannot incorporate microscale variations in topography and vegetation that impact wind speeds in a 1-km region in the vicinity of a specific power transmission line span.

The blowout-derived anemometer method described here provides microscale wind speed and direction information for the 1 km vicinity of a monitored transmission line span that is responsive to local topography and vegetation variations that are smaller than a typical multi-kilometer NWP domain.

Figure 11:
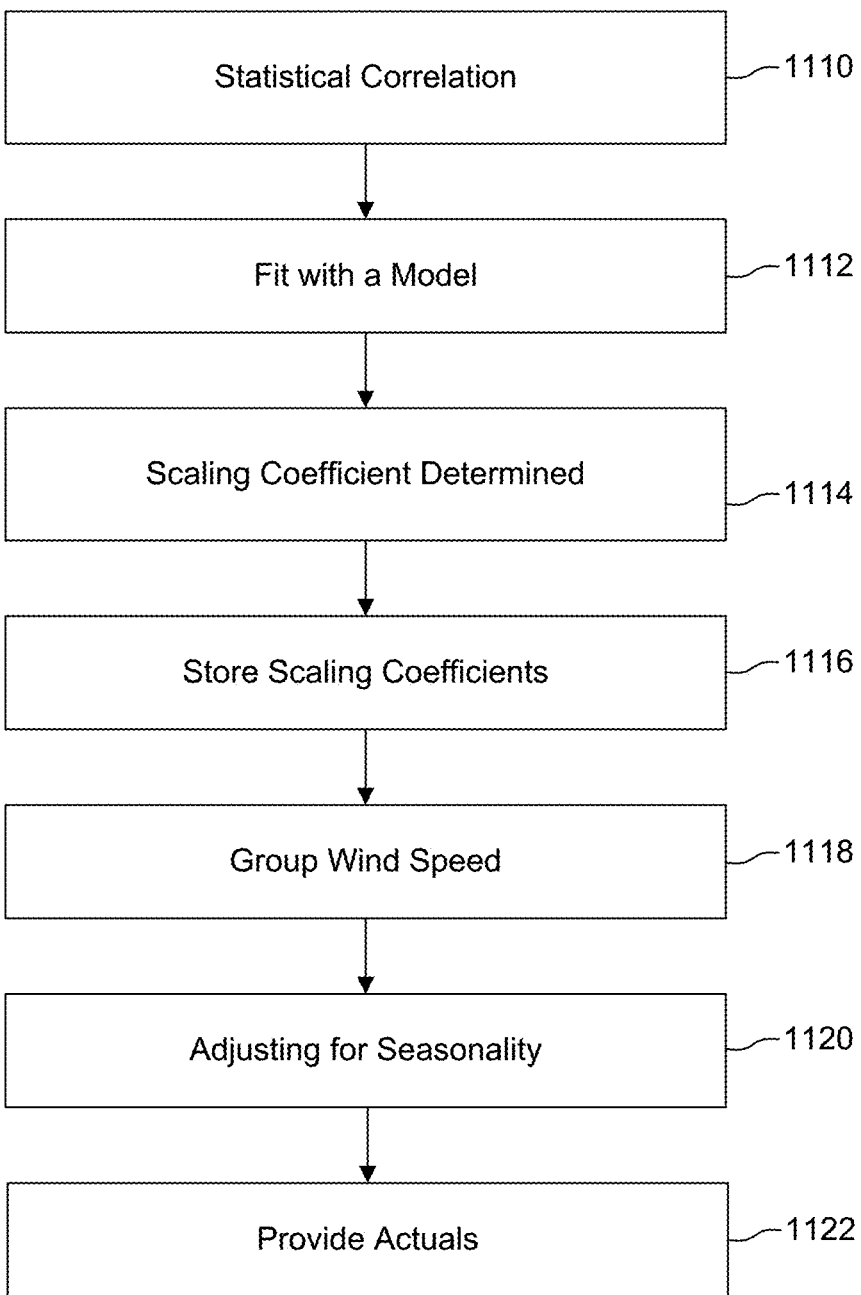
FIG. 11 is a flow diagram how a wind scaling coefficient relates the microscale wind speeds at a particular span to the macroscale.

FIG. 11 is a flow diagram illustrating how a wind scaling coefficient relates the microscale wind speeds at a particular span, to the macroscale wind speeds for the multi-kilometer NWP domain that contains the span, can be produced.

In step 1110, a statistical correlation is constructed between independently measured blowout-derived wind speeds, and the coarsely gridded NWP wind speed forecast for the same location and timestamps.

The data is then fit with a model in step 1112. This can be a linear regression model, to produce a slope of the fitted line which is equivalent to the local wind speed scaling coefficient.

From the model, scaling coefficient is determined in step 1114. For example, if the slope (the scaling coefficient) of the statistical analysis is 1.0, then the blowout-derived wind speed corroborates that the mean wind speed at the span is the same as the mean wind speed for the macroscale NWP domain. If the resulting scaling coefficient for a different site is 0.65, then it can be concluded that the span localized blowout-derived wind speed is on average 35% lower than the macroscale NWP wind speed. Wind speed scaling coefficients from this statistical analysis will typically range from 0.2 (for a span at the bottom of a densely forested wind sheltered valley), to 1.3 (for a highly wind-exposed ridge top with no vegetation).

Figure 12:
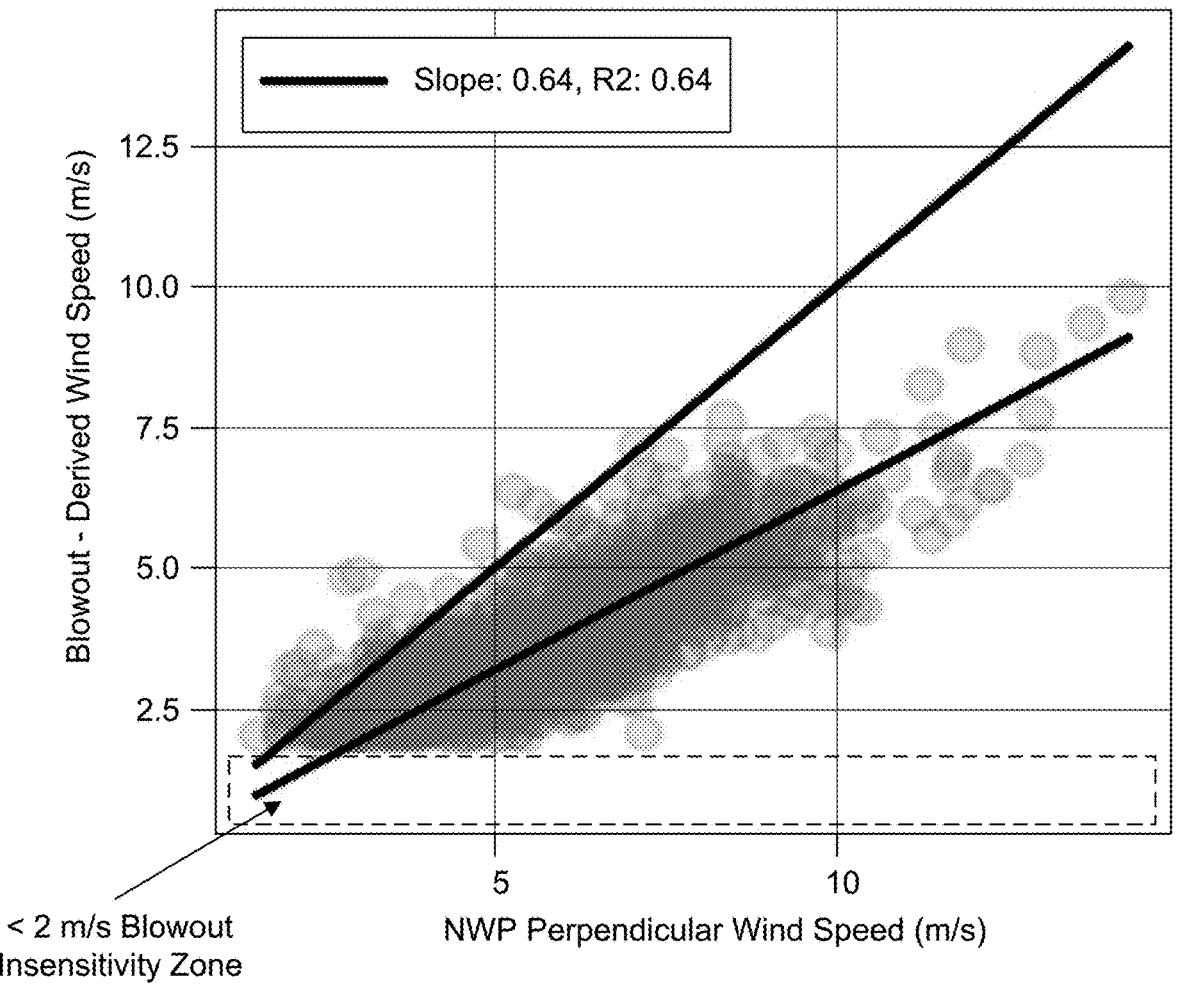
FIG. 12 is a plot of blow-out derived wind speed as a function of NWP perpendicular wind speed.

FIG. 12 is a plot of blow-out derived wind speed as a function of NWP perpendicular wind speed. This example data was collected for a wind fetch sector centered on the 300-degree azimuthal position. The circle points pair observed blowout-derived wind speeds determined from LIDAR sensor measurements with NWP perpendicular wind speeds for the sensor site. The lower line is the line of best-fit through the points. The upper line is y=x, or a hypothetical model in which NWP wind speeds and blowout-derived wind speeds are perfectly matched in magnitude. In this case, the blowout-derived wind speeds suggest that the NWP perpendicular wind speeds are overestimated, likely due to the lack of detailed handling of local topology and roughness factors in the NWP model.

Returning to FIG. 11, in step 1116, the scaling coefficients produced by this method are be stored in a database and used to adjust (re-scale) future forecasted wind speeds from the NWP by the microcontroller 50 and/or central server and analytics engine 130.

Standardized Wind Measurement Adjustments

Many wind measurement data sources rely on standardized anemometer instruments placed at standardized heights, and typically in open, flat, unobstructed environments. Examples of these would be Meteorological Terminal Air Report ("METAR") station data, which are commonly associated with airports across North America. In addition, dedicated anemometers (ultrasonic, or cup-and-vane) can be placed proximal to power transmission lines in standardized arrangements (height, terrain, instrumentation). These meteorological data sources can also serve as inputs for DLR calculations associated with transmission lines. In these cases, the use of the blowout-derived anemometry method described herein can be used to adjust or re-scale the wind speeds and directions obtained from these types of standardized meteorological measurements. Because the monitored transmission line conductors typically traverse highly nonstandard environments with varying heights, elevations, terrain types, and forest cover, the use of METAR or other standardized wind measurement data can be rescaled and made more accurate when corrected for the specific elevation, topography, wind fetch, and local land use environments near transmission lines when equipped with the blowout-derived wind speed monitoring system.

Wind Angle Sector Slices

Figure 13:
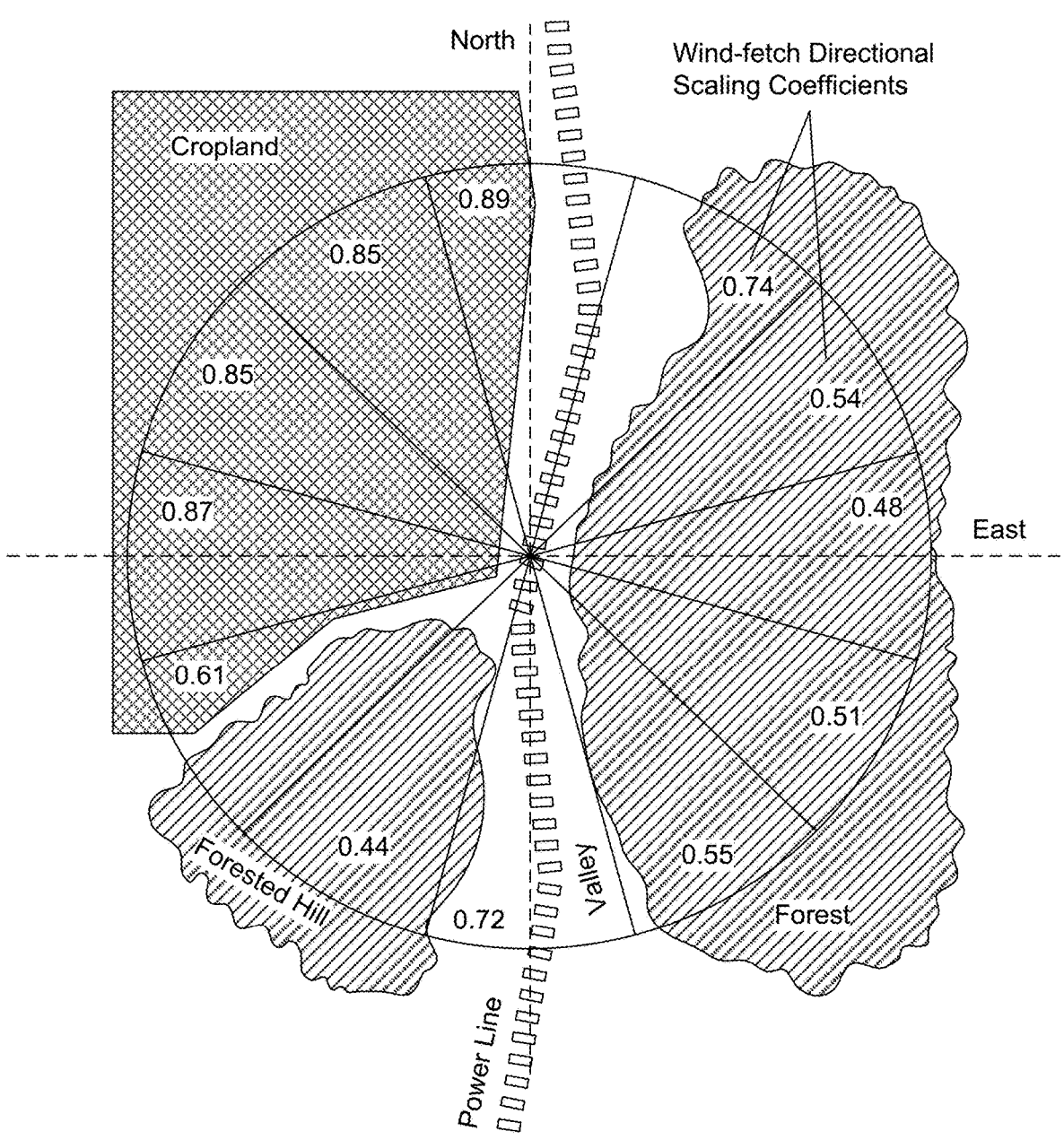
FIG. 13 shows a transmission line with exemplary surrounding features.

FIG. 13 shows a transmission line with exemplary surrounding features. The Upwind fetch sectors are divided into 30-degree sections. The land use and terrain/topography of the upwind fetch is used to compute a wind speed rescaling factor for winds originating from the fetch direction range. These factors can be compared to empirical data collected from the blowout anemometer device in order to increase the accuracy and safety of DLR calculations computed from both NWP weather data sources and conductor observations/measurements.

An illustration of the upwind fetch sector approach is shown, in which a predominantly north-south power line right-of-way is bordered by varying terrain and land use types, leading to a corresponding range of wind speed scaling coefficients corresponding to winds from each of the directional slices.

For a given location, the wind speeds near the surface of the Earth are predominantly affected by the topography, vegetation, and surface obstructions in the area upwind of the measurement location. This upwind area is called the upwind fetch. A good rule of thumb is that the relevant upwind fetch extends for a distance of twenty (20) times the wind measurement height. For typical power transmission conductor heights up to 50 meters height for the highest conductor on a tower, the relevant upwind fetch therefore extends over a distance of approximately 1 kilometer.

For a given power line span, winds coming from different compass directions will have traversed upwind fetches of terrain having different surface characteristics. As an illustrative example, a power transmission line span which traverses East-to-West across a wide river running North-to-South, will have upwind fetches from the North and South with winds that primarily traverse a low-friction water surface. In contrast winds from the East and West traverse an upwind fetch consisting primarily of the forested and hilly banks of the river. Therefore in this illustrative example, the surface wind speeds blowing from the North and South along the river will be higher than the average for a multi-kilometer NWP region, and the winds blowing from the East and West from the forested banks of the river will have lower than the average wind speed for a multi-kilometer NWP region.

Given the likely variation in topography and vegetation for the upwind fetches forming a circular area around a power line span, it is important to do statistical analysis using wind data that is grouped by wind direction, so that winds traversing the same upwind fetch are effectively grouped together for further analysis and comparison to blowout-derived wind speeds. This is typically performed by the analytics engine 130 since it has data from many dispersed sensors. One convenient implementation of a simplified grouping by wind direction, is to define twelve (12) direction sectors, consisting of 30 degree angular bins. A convenient scheme for selecting and grouping the sectors is to define a North-facing sector that is centered on 0 degrees, a North-Northeast sector centered on 30 degrees, an East-Northeast sector centered on 60 degrees, an East sector centered on 90 degrees, and so on. Grouping data in 30 degree sectors also ensures enough observations to perform a statistically relevant analysis, especially for wind directions that are not historically common at a given site.

For the purposes of determining wind scaling coefficients, the blowout-derived wind speed data is grouped with NWP weather data by 30 degree direction sectors and datetime in step 1118. In this way, a wind scaling coefficient can be calculated for each wind direction sector independently, and the wind scaling coefficient for each direction sector can be independently compared to expected values for a similar upwind fetch terrain.

Seasonal or Land Use Adjustments

Land use changes, such as the clear cutting of an adjacent forest, or cropland that is converted to new housing subdivisions, will cause changes in local surface wind speed characteristics. These land use changes alter the aerodynamic roughness of the upwind fetch in the vicinity of a power line span and introduce a different surface drag on the surface layers of the atmosphere than was present before the change in land use. For example, after clearcutting a forest, winds from the direction of the clearcut area will exhibit higher mean wind speeds than before the clearcutting of the forest. These changes in average wind speeds may be detectable from local wind speed measurements, such as blowout-derived anemometry measurements, even before land use databases can reflect the changes via infrequently updated satellite or aerial surveys.

Additionally, the aerodynamic roughness of the upwind fetch in the vicinity of a power line may change seasonally, even without a change in land use category. As an illustrative example, consider a corn field, which in Winter will be aerodynamically smooth and covered with snow, in Spring may be freshly tilled and planted with small corn seedlings, in Summer is covered with mature corn plants, and in Fall is covered with dried and broken harvested corn stalks. Each of these conditions for the corn field will present a different level of aerodynamic surface roughness and consequently slow surface winds to varying degrees. The same effect is true of deciduous forests, which have different aerodynamic roughness characteristics in Summer (when the forest is fully leafed out) versus Winter (when the forest is barren of leaves).

These predictable seasonal changes in the aerodynamic surface roughness for croplands and deciduous forest and considering slower cycles from categorical changes in land use, it is therefore desirable for the analytics engine 130 to systematically and periodically revisit localized wind speed scaling coefficients over time adjusting for seasonality in step 1120. Instead of a single calibration period at the time of installation of a blowout-derived wind speed instrument, it is desirable to continuously monitor wind speed patterns over time across seasons and years and perform statistical analysis to determine appropriate wind speed scaling coefficients that are periodically updated match evolving changes in land use by the analytics engine 130. These continuously updated scaling coefficients are stored in a database, along with an audit record of previous seasonal and annual values for wind scaling coefficients that were previously applied to historic data.

In some examples, the data is employed for ground truth validation of wind actuals in remote areas in step 1122. In some areas of the world where global weather forecasts have unknown accuracy, the system's data is used to validate forecast accuracy and for example the arrival times of weather patterns in remote areas.

Sample Data

Figure 14:
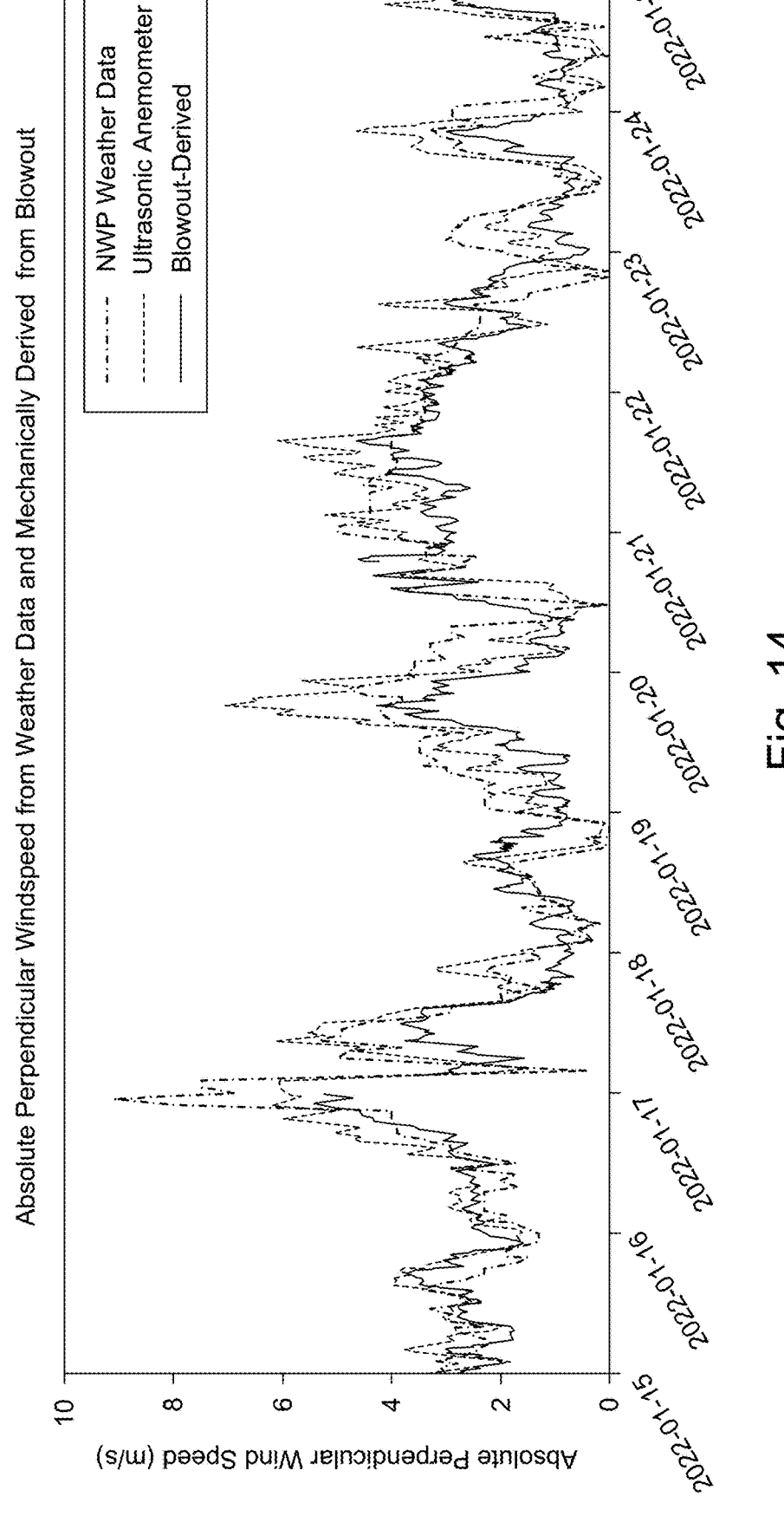
FIG. 14 shows timeseries data showing strong correlation between absolute perpendicular wind speeds determined from NWP weather data, local ultrasonic anemometer monitoring, and using the blowout-derived wind speed method.

FIG. 14 shows timeseries data showing strong correlation between absolute perpendicular wind speeds determined from NWP weather data, local ultrasonic anemometer monitoring, and using the blowout-derived wind speed method described herein, obtained using the optical sensor/scanner device placed on a transmission tower below the overhead conductors.

The data compares three types of wind speed measurement data for the same site and period. In this plot, a strong correlation is shown between absolute wind speed measurements measured by local ultrasonic anemometers, NWP weather data models, and the blowout-derived wind speed measurement when applied to a real monitored transmission span in the eastern United States. In this case, both NWP and anemometer-measured wind speeds largely agree in approximate magnitude, and re-scaling coefficients significantly different than 1.0 are not required to achieve good alignment of the wind speed data between measurement types.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for estimating wind speeds around transmission lines, the method comprising:

using sensors positioned along spans of the transmission lines to measure positions of conductors of the transmission lines;

using anemometers positioned along the spans of the transmission lines to measure wind speeds at the transmission lines;

generating, by microcontrollers positioned at the transmission lines, via the sensors, sensor data indicative of the measured positions of the conductors;

determining, by the microcontrollers and/or by a central server, conductor blowout for the conductors based on the sensor data;

receiving, by the central server, the measured wind speeds via the anemometers and the microcontrollers;

receiving, by the central server, the sensor data and/or the determined conductor blowout via the sensors and the microcontrollers;

constructing, by the central server, statistical correlations between the determined conductor blowout and the measured wind speeds for spans of the transmission lines;

generating, by the central server, local wind speed scaling coefficients; and using, by the central server, the wind speed scaling coefficients to estimate wind speed for spans from forecasted wind speeds.

2. The method of claim 1, wherein the forecasted wind speeds are derived from Numerical Weather Prediction (NWP).

3. The method of claim 1, wherein constructing the statistical correlations includes using measured blowout-derived wind speeds and measured wind speeds for same timestamps.

4. The method of claim 1, further comprising performing statistical analysis using wind data that is grouped by wind direction.

5. The method of claim 4, wherein the grouping by wind direction is based on several, such as twelve, sectors.

6. The method of claim 1, further comprising seasonally adjusting the local wind speed scaling coefficients.

7. The method of claim 1, further comprising assessing local vertical wind speed profiles.

8. The method of claim 1, wherein the conductors are measured with optical clearance sensors.

9. The method of claim 8, wherein the optical clearance sensors include LIDAR sensors.

10. The method of claim 8, wherein the optical clearance sensors include camera-based sensors.

11. The method of claim 1, further comprising measuring encroachment.

12. The method of claim 1, further comprising providing a ground truth weather assessment.

13. A system for estimating wind speeds around transmission lines, the system comprising:

sensors positioned along spans of the transmission lines, wherein the sensors measure positions of conductors of the transmission lines;

anemometers positioned along the spans of the transmission lines, wherein the anemometers measure wind speeds at the transmission lines; and a computer system comprising microcontrollers positioned at the transmission lines and a central server, wherein the microcontrollers generate sensor data indicative of the measured positions of the conductors, the microcontrollers and/or the central server determine conductor blowout for the conductors based on the sensor data, the central server receives the measured wind speeds via the anemometers and the microcontrollers, the central server receives the sensor data and/or the determined conductor blowout via the sensors and the microcontrollers, and the central server constructs statistical correlations between the determined conductor blowout and the measured wind speeds for spans of the transmission lines, generates local wind speed scaling coefficients, and uses the wind speed scaling coefficients to estimate wind speed for spans from forecasted wind speeds.

14. The system of claim 13, wherein the forecasted wind speeds are derived from Numerical Weather Prediction (NWP).

15. The system of claim 13, wherein the computer system constructing the statistical correlations includes using measured blowout-derived wind speeds and measured wind speeds for same timestamps.

16. The system of claim 13, wherein the computer system performs statistical analysis using wind data that is grouped by wind direction.

17. The system of claim 16, wherein the grouping by wind direction is based on a several, such as twelve, sectors.

18. The system of claim 13, wherein the computer system seasonally adjusts the local wind speed scaling coefficients.

19. The system of claim 13, wherein the computer system assesses local vertical wind speed profiles.

20. The system of claim 13, wherein the sensors are optical clearance sensors.

21. The system of claim 20, wherein the optical clearance sensors include LIDAR sensors.

22. The system of claim 20, wherein the optical clearance sensors include camera-based sensors.

23. The system of claim 13, wherein the computer system assesses encroachment.

24. The system of claim 13, wherein the computer system is used for ground truth weather assessment.

* * * * *